United States Patent [19]
Sakamoto et al.

[11] Patent Number: 5,663,097
[45] Date of Patent: Sep. 2, 1997

[54] METHOD OF FABRICATING A SEMICONDUCTOR DEVICE HAVING AN INSULATING SIDE WALL

[75] Inventors: Masaru Sakamoto, Atsugi; Kei Fujita, Sagamihara, both of Japan

[73] Assignee: Canon Kabushiki Kaisha, Tokyo, Japan

[21] Appl. No.: 313,947

[22] Filed: Sep. 28, 1994

Related U.S. Application Data

[63] Continuation of Ser. No. 901,032, Jun. 19, 1992, abandoned.

[30] Foreign Application Priority Data

Jun. 21, 1991 [JP] Japan ..................... 3-150451

[51] Int. Cl.⁶ ........................................ H01L 21/44
[52] U.S. Cl. ................ 438/372; 438/675; 438/681
[58] Field of Search ..................... 437/31, 203, 162, 437/187, 40, 43, 164, 90, 190

[56] References Cited

U.S. PATENT DOCUMENTS

| | | | |
|---|---|---|---|
| 4,531,282 | 7/1985 | Sakai et al. | 437/31 |
| 4,546,536 | 10/1985 | Anantha et al. | 437/31 |
| 4,621,413 | 11/1986 | Lowe et al. | 29/571 |
| 4,814,846 | 3/1989 | Matsumoto et al. | |
| 4,816,889 | 3/1989 | Matsumoto . | |
| 4,816,899 | 3/1989 | Strolle et al. | 358/12 |
| 4,879,254 | 11/1989 | Tsuzuki et al. | 437/203 |
| 4,885,259 | 12/1989 | Osinski et al. | 437/43 |
| 4,892,837 | 1/1990 | Kudo | 437/31 |
| 5,006,911 | 4/1991 | Sivan | 357/23.11 |
| 5,010,026 | 4/1991 | Gomi | 437/31 |
| 5,089,425 | 2/1992 | Hoshi et al. | 437/3 |
| 5,208,172 | 5/1993 | Fitch et al. | 437/40 |
| 5,279,976 | 1/1994 | Hayden et al. | 437/31 |
| 5,296,391 | 3/1994 | Sato et al. | 437/90 |

FOREIGN PATENT DOCUMENTS

| | | | |
|---|---|---|---|
| 0420595 | 4/1991 | European Pat. Off. . | |
| 2525029 | 10/1983 | France . | |
| 0057955 | 5/1979 | Japan | 437/164 |
| 0072321 | 5/1982 | Japan . | |
| 61-184872 | 8/1986 | Japan | H01L 29/72 |
| 62-179760 | 8/1987 | Japan | H01L 27/14 |
| 0205522 | 8/1989 | Japan | 437/164 |
| 2-301142 | 12/1990 | Japan . | |

*Primary Examiner*—Tuan H. Nguyen
*Attorney, Agent, or Firm*—Fitzpatrick, Cella, Harper & Scinto

[57] ABSTRACT

A method of fabricating semiconductor devices comprises the following process of: forming an electrode leading out window having its vertical side wall at a given position in the functional element formed on a semiconductor substrate; forming an insulating film on the surface of the side wall; and depositing an electrode metal in the leading out window.

3 Claims, 5 Drawing Sheets

METHOD OF FABRICATING A SEMICONDUCTOR DEVICE HAVING AN INSULATING SIDE WALL

This application is a continuation of application Ser. No. 07/901,032 filed Jun. 19, 1992, now abandoned.

BACKGROUND OF THE INVENTION

1. Field of the Invention

The present invention relates to a method of fabricating semiconductor devices used for various electronic equipment and devices. More particularly, the invention relates to a method of fabricating a semiconductor device provided with an insulating wall in the portion where the semiconductor area containing impurity and the electrodes are in contact.

2. Related Background Art

In recent years, along with the evolution of semiconductor integrated circuits which have increasingly become more highly integrated, the super-miniaturization of elements are advancing creaselessly.

At present, taking the emitter size of a bipolar transistor (the minimum machinining dimension) as an example, the miniaturization has advanced to the extent that it is approximately 1.0 to 1.5 µm by the conventional method using photolithography and 0.5 to 1.0 µm by the method using self-alignment. Therefore, the contact size formed in the emitter has also become approximately 0.5 to 0.8 µm making it necessary to use an exposure apparatus at its resolution limit. Also, the formation method of the electrode which is connected to the contact hole has come to its limit due to its covering capability and contacting capability.

The conventional emitter formation method is disclosed in the specifications of U.S. Pat. No. 4,814,846 granted to Matsumoto et al under the title of "PHOTOELECTRIC CONVERTING DEVICE" and U.S. Pat. No. 4,816,899 also granted to Matsumoto et al under the title of "PHOTO-ELECTRIC CONVERTING", for example. There are also emitter formation methods disclosed in Japanese Patent Laid-Open Application Nos, 61-184872 and 62-179760, for example.

Among the emitter formation methods, there is One called "washed emitter process".

Figure 1:
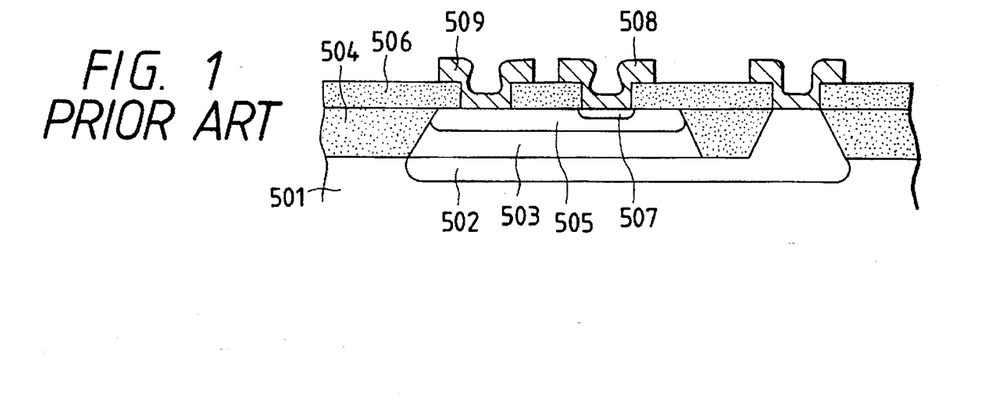
FIG. 1 is a cross-sectional view schematically showing a conventional semiconductor device.

FIG. 1 is a schematic view showing a semiconductor device fabricated using the conventional washed emitter process.

Now, for example, the structure of a semiconductor device including an emitter portion is shown in FIG. 1, in which a reference numeral 501 designates a semiconductor substrate; 502, an N-type buried area formed to reduce collector resistance and N-type area formed to lead out a collector electrode; 503, an N$^-$ area; 504, an element separation area formed by oxidation film; 505, a P-type base area; 506, an insulating film; 507, an N-type emitter; 508 and 509, electrodes. With this structure, the emitter size and contact size are of the same value to provide an advantage in the miniaturization of the device.

The fabricating processes therefor will be described briefly. At first, on the semiconductor substrate 501, there are formed the N-type varied area 502, N-type area 503, element separation area 504, base area 505, and insulating film 506. Then, a part of the insulating film 506, on which the emitter must be formed, is removed.

Subsequently, with the insulating film 506 used as a mask, ion is injected to induce impurity and others. Then, a heat treatment is given to form the reverse conductive type emitter area 507 in the base area 505.

After that, the emitter electrode 508 is formed.

Nevertheless, there are still some technical problems to be solved for this method.

One of the problems is that this method requires the introduction of impurity (ion injection) subsequent to the etching of the insulating film 506 and then the impurity is activated by a heat treatment, thus necessitating the high temperature heat treatment which results in the external diffusion of impurity to make the transistor characteristics unstable. Another is that as the circuit integration becomes higher (finer), it becomes more difficult to make the emitter diffusion sufficient, and the resultant lateral diffusion of, the emitter is not good enough and causes the emitter electrode 508 and the base diffusion layer 505 to be short circuited, thus lowering the yield of transistors.

SUMMARY OF THE INVENTION

It is an object of the present invention to solve the above-mentioned technical problems and provide a method of fabricating semiconductors whereby to enable a high yield fabrication.

It is another object of the present invention to provide a method of fabricating semiconductors of small parasitic capacity which can be driven at high speeds.

It is still another object of the present invention to provide a method of fabricating semiconductors whereby to enable its fabrication finer than the resolution limit in photolithography.

It is a further object of the present invention to provide a method of fabricating highly reliable semiconductors.

In order to achieve the above-mentioned object, a method according to the present invention is characterized by including a process of forming an electrode leading out window having a vertical side wall at a given position in the functional element formed on a semiconductor substrate, a process of forming an insulating film on the surface of the aforesaid wall, and a process of depositing an electrode metal in the aforesaid leading out window.

Particularly, it is preferable to perform a part of the aforesaid process to introduce impurity for the formation of the functional element before the aforesaid formation process of the insulating film or to perform a part of the aforesaid process to introduce impurity for the formation of the functional element after the aforesaid formation process of the insulating film.

Another method for the achievement of the object of the present invention is a method of fabricating semiconductors characterized by including the following step of:

preparing a semiconductor area and a substrate having an insulating film formed on the aforesaid semiconductor area;

forming an open hole in the aforesaid insulating film;

introducing impurity into the aforesaid semiconductor area at a position corresponding to the aforesaid open hole;

forming an insulating area on the side wall in the aforesaid open hole; and forming the electrode in the aforesaid open hole, which is in contact with the area where the aforesaid impurity has been introduced.

In the present invention, an insulating film is formed on the side wall of a metal electrode leading out window having a vertical step, making it possible to make the area of the opening of the metal electrode leading out window smaller by an amount equivalent to the thickness Of the insulating film.

DETAILED DESCRIPTION OF THE PREFERRED EMBODIMENTS

A preferred embodiment according to the present invention is method including the steps of performing the introduction of impurity into a semiconductor substrate through an electrode leading out window on an insulating film, subsequent thereto, forming further an insulating film, etching the insulating film to leave the side wall in the window intact, and forming an electrode diffusion layer in which the impurity has been introduced.

For the semiconductor material used for the present invention, there are silicon, germanium, gallium arsenide, and other known materials.

As methods of introducing impurity, there are ion injection, solid phase diffusion, vapor diffusion, and other known impurity introduction, which can be used for the present invention.

As methods of forming electrodes, vacuum deposition, sputtering, CVD, or others can be used. Also, for the electrode material, there can be used Al, Cu, Mo, W, or other metal or alloy, or metallic siliside, or, further, polysilicon or the like which contains impurity.

Then, for the electrode formation processes according to the present invention, it is preferable to deposit an electrode material at first in the electrode leading out window by the use of a selective deposition method, and after that, a non-selective deposition and patterning are performed to from an electrode having a desirable convering capability.

Particularly, for any contact hole which has a size less than the resolution of a photolithography, its aspect ratio becomes more than 1.0, and there is encountered a serious problem of step converage. Therefore, the above-mentioned selective/non-selective deposition methods are adopted in order to improve the reliability of the step converage.

For the selective deposition method, it is preferable to use a biased sputtering method, CVD method Using organic metal, CVD method using six tungusten fluoride ($WF_6$), or the like.

Now, the embodiments according to the present invention will be described in conjunction with the accompanying drawings. However, it is to be understood that the present invention is not limited to the embodiments set forth below.

(Embodiment 1)

Figure 2A:
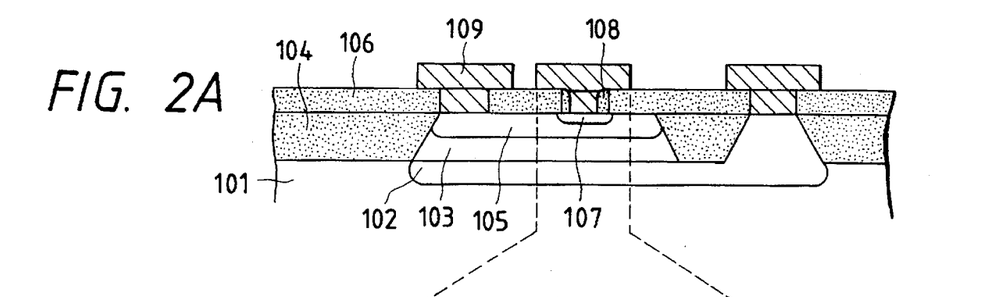
FIG. 2A is a cross-sectional view schematically showing a semiconductor device according to first and second embodiments of the present invention.
Figure 2B:
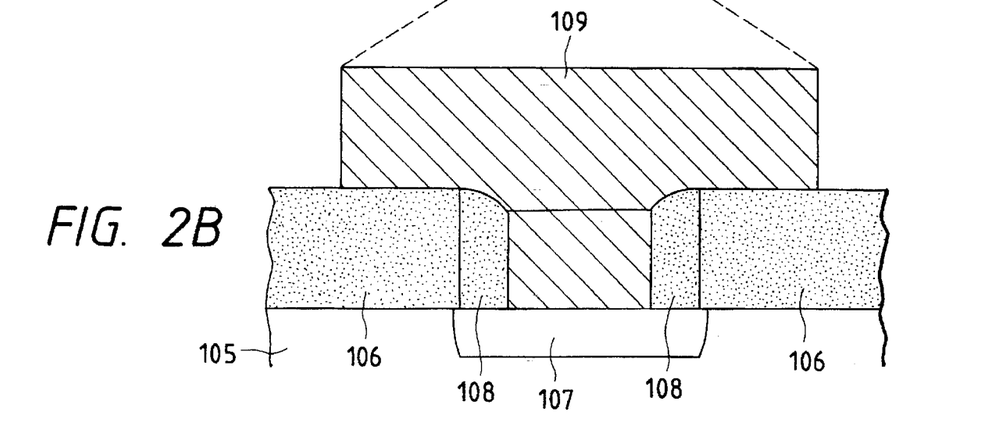
FIG. 2B is an enlargement of the emitter portion of the semiconductor shown in FIG. 2A.

FIG. 2A is a cross-sectional view showing an NPN bipolar transistor according to the present embodiment and FIG. 2B is an enlargement of the emitter electrode portion thereof.

A reference numeral 101 designates a P-type substrate; 102, an N-type varied area formed to reduce the collector resistance and an N-type area to lead out the collector electrode; 103, an $N^-$ area (epitaxial layer); 104, an element separation area by oxidation film; 105, a P-type base area; 106, an insulating film; 107, an N-type emitter area; 108, the side wall area of an insulating film for the emitter contact; and 109, a metal electrode, formed by an organic metal CVD method, having a high covering capability.

FIGS. 3A through 3E are schematic views illustrating the fabricating processes for the bipolar transistor shown in FIG. 2.

Figure 3A:
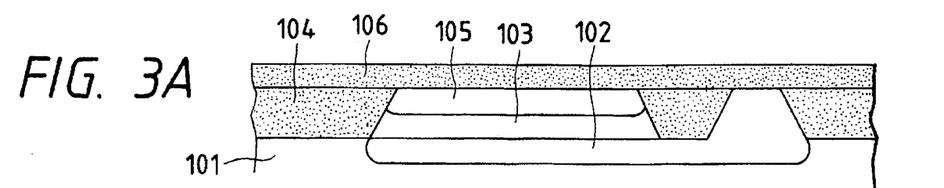
FIGS. 3A through 3E are views illustrating the fabricating processes for a semiconductor device according to the first embodiment of the present invention.

Subsequent to the N-type area 102 having been formed at a given position on the P-type semiconductor substrate 101, the N-type epitaxial area 103 is formed. Then, continuously, silicon On the desired locations is etched to form the element separation area 104 by oxidizing only such portions selectively.

Thereafter, P-type impurity is introduced into the desired location to form the P-type base area 105 and, further, the insulating film 106. Thus, by giving a heat treatment, the structure is obtained as shown in FIG. 3A.

Figure 3B:
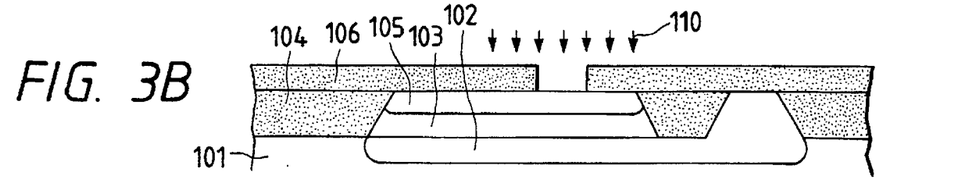
Figure 3C:
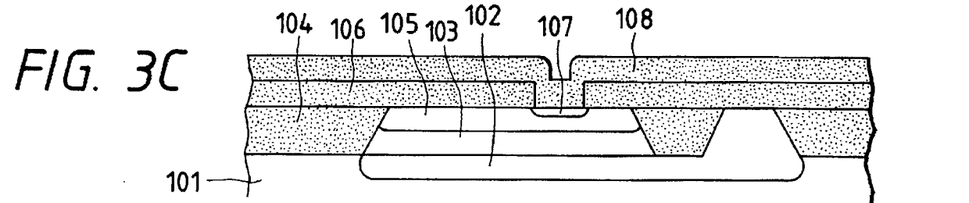
Figure 3D:
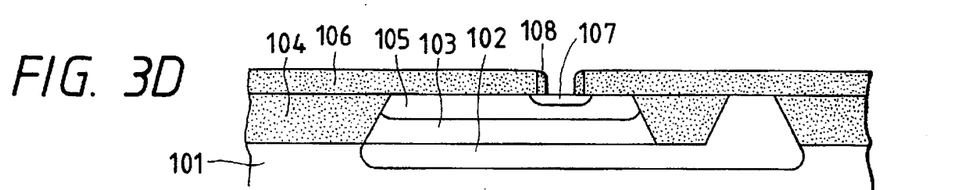

Subsequently, a resist patterning is given. Then, using an etching apparatus having parallel flat electrodes, the given portions of the insulating film 106 are removed by etching to allow a part of the area 105 to be exposed. The section thus obtained by the etching is essentially of a vertical shape due to the anisotropic etching. In continuation, after the resist is peeled off, a thermal oxidation film (not shown) is formed for a thickness of, approximately 50 Å, into which the As which is an ion seed for the emitter formation is injected by an ion injection (110) (FIG. 3B). Then, the insulating film 108 is formed by a CVD method on the emitter 107 and insulating film 106 thus produced. A heat treatment is given at approximately 950° C. (FIG. 3C). Subsequently, on the same conditions as described earlier, an overall etching is performed to form a side wall on the side face of the insulating film 106 as shown in FIG. 3D. Here, for example, a film having a comparatively high etching rate at a certain etching condition is used for the insulating film 106 in which an open hole is provided. Also, for the insulating film 108 to form the side wall, a film having a comparatively low etching rate at the aforesaid condition is used.

More specifically, it is desirable to use a silicon dioxide (PSG) film containing phosphorus or a silicon dioxide (BPSG) film containing boron and phosphorus for the insulating film 106 while it is desirable to use a silicon nitride film which can be formed by various CVD methods or a silicon dioxide film formed by a thermal oxidation method for the insulating film 108. Also, if a condition is such that a certain ratio of etching selections can be considered, it may be possible to combine the silicon nitride which is prepared by the reduced pressure CVD method for the insulating film 106 and the silicon nitride which is prepared by the plasma CVD method for the insulating film 108.

For, example, under an etching condition using pressure 1.8 Torr, discharging power 500 W, and combined gasses of $CHF_3$ for 40 SCCM, $CF_4$ for 40 SCCM, and Ar for 500 SCCM, the etching rate can be as follows:

approximately 9,700 Å/min for PSG approximately 7,400 Å/min for BPSG approximately 4,500 Å/min for silicon nitride by plasma CVD method approximately 2,700 Å/min for silicon nitride by reduced pressure CVD method approximately 4,600 Å/min for silicon dioxide by thermal oxidation method Therefore, it should be possible to select the combination of films to be used appropriately from among them.

Figure 3E:
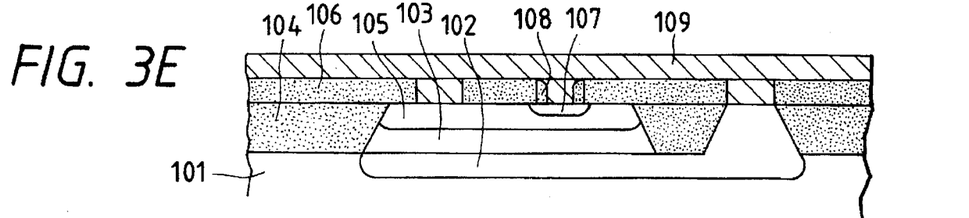
Figure 4:
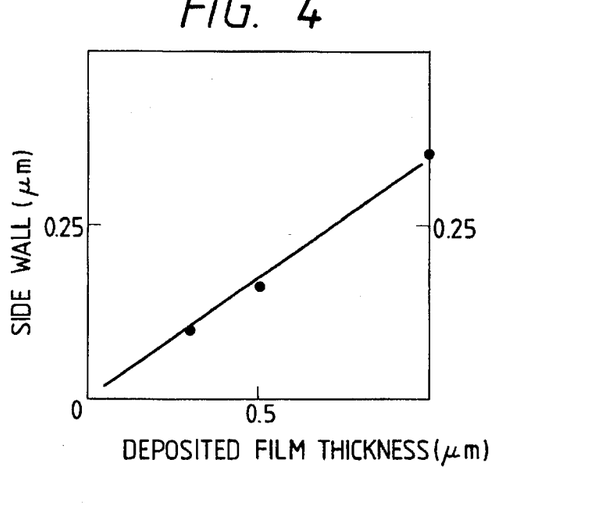
FIG. 4 is a graph showing the relation between the deposited film thickness and the amount of the side wall, which serves as parameter for forming an insulating side wall to be used for the present invention.

In this respect, FIG. 4 shows the deposited film thickness by the CVD method and the side wall amounts. The side wall amounts and deposited film thicknesses are in a linear relation. Hence enabling a side wall to be formed in an arbitrary thickness. After this, as shown in FIG. 3E, contact holes other than the one in the emitter portion are formed, and a metal film 109 is formed. More precisely, the inside of the openings is filled with Al by a selective deposition method, which wily be described later, and further, by a normal CVD method or sputtering method, the Al film 109 are formed all over the insulating film 106 and the selectively deposited Al. Then, with the patterning of metal wirings, the bipolar transistor shown in FIG. 2 is obtained.

Now, hereunder, the description will be made of a method (Al-CVD method) of forming a metal film (including pure Al) with Al as its main component, which is preferable as one of the electrode formation methods according to the present invention.

(Film Formation Method)

This method is a method suitable for filling a metallic material into a fine and deep hole (contact hole or through hole) having an aspect ratio of 1 or more, for example. Also, it is a deposition method having an excellent selectivity.

Then, the metal film formed by this method has an extremely fine crystallinity so that a monocrystal Al is formed, and carbon or the like can scarcely be contained therein.

Likewise, this metal has a specific resistance of as low as 0.7 to 3.4 μΩcm and a reflection factor of as high as 85 to 95%. It also has an excellent surface having hillock density of 1 μm or more being approximately 1 to 100 $cm^{-2}$.

Also, the occurrence probability of alloy spike at the phase boundary to silicon is substantially equal to zero in terms of the destruction probability of a 0.15 μm semiconductor junction.

This method is a method of forming a deposited film on an electron donative substrate by surface reaction using an alkyl aluminum hydride gas and hydrogen gas. Particularly, as material gas, the alkyl aluminum hydride which contains methyl group such as monomethyl aluminum hydride (MMAH) or dimethyl aluminum hydride (DMAH) is used and as reaction gas, an $H_2$ gas is used, and when the substrate surface is heated under a mixed gas of these components, it is possible to deposit the Al film having an excellent quality.

Here, it is preferable to maintain the surface temperature of the substrate at a decomposition temperature of alkil aluminum hydride (180° C.) or more and less than 450° C. by a direct heating or indirect heating at the time of Al selective deposition, or more preferable, at 260° C. or more and less than 440° C., or most suitable, at 260° C. or more and less than 350° C.

As a method of heating the substrate preferably within the above-mentioned temperature ranges, there are direct heating and indirect heating. Particularly, when the substrate is held at the above mentioned temperatures by the direct heating, it is possible to form the Al film having an excellent quality at high deposition speed. For example, when the surface temperature of the substrate is maintained within the more preferable temperature range at the time of the Al film formation, that is, 260° C. to 440° C. the film of an excellent quality can be obtained at a deposition speed which is higher than the case of a resistive heating of 3,000 Å to 5,000 Å/min. As a direct heating method such as this (namely, a method of heating the substrate itself by transmitting energy from a heating means directly to the substrate), a halogen lamp, xenon lamp, or other lamp heating can be named, for example. Also, as an indirect heating method, there is the resistive heating which can be given through an exothermic body installed on a substrate holding member arranged in the deposited film formation space for holding the substrate on which the deposited film is formed.

If a CVD method is applied with this method to the substrate on which the electron donative surface portion and non-electron donative surface portion coexist, the Al monocrystal is formed with an excellent selectivity only on the electron donative surface portion of the substrate.

The electron donative material is a substrate in which free electron is present or free electron is intentionally created, and on the surface of which a chemical reaction can be promoted by the electron transfer and reception between the substrate and the material gas molecules adhering to the substrate surface. In general, for example, metals and semiconductors are regarded as corresponding thereto. Also, the material having a thin oxidation film on its metallic or semiconductor surface is included in the electron donative materials according to the present invention because such a material can transfer and receive electron between the substrate and the molecules of the material adhering thereto for the generation of chemical reaction.

As specific examples of the electron donative materials, there can be named, for example, the III–V group compound semiconductor of a dual system or ternary system or more produced by combining Ga, In, Al, or the like as III group element and P, As, N, or the like as V group element, or P-type, I-type, or N-type semiconductor material of a monocrystal silicon, amorphous silicon, or others, or the metals, alloys, silicides given below, for example: tungusten, molybdenum, tantalum copper, titanium, aluminum, titanium aluminum, titanium nitride, aluminum silicon copper, aluminum palladium, tungusten silicide, titanium silicide, aluminum siliside, molybdenum siliside tantalum silicide, NiCr and other alloys, $ZrB_2$, $HfB_2$, and other metallic boride, Ir, and others.

Meanwhile, as the non-electron donative materials which form the surface on which Al or Al—Si cannot be deposited selectively, there can be named a glass or oxidation film or thermal nitriding film of the silicon dioxide, BSG, PSG, BPSG, and the like, produced by a thermal oxidation, CVD, sputtering, and others, and a silicon nitride film, or the like produced by a plasma CVD, reduced pressure CVD, ECR-CVD, or the like method.

By this Al-CVD method, it is possible to deposit a metal film which contains Al as its main component and modification elements given below as well. The quality of the film thus obtained displays excellent characteristics.

For example, in addition to the alkyl aluminum hydride gas and hydrogen, a gas containing Si element such as $SiH_4$, $Si_2H_6$, $Si_3H_8$, $Si(CH_3)_4$, $SiCl_4$, $SiH_2Cl_2$, or $SiHCl_3$, a gas containing Ti element such as $TiCl_4$, $TiBr_4$, or $Ti(CH_3)_4$, and a gas containing Cu element such as bisacetyl acetonite copper Cu $(C_5H_7O_2)_2$, bisdipibaroyl metanite copper Cu $(C_{11}H_{19}O_2)_2$, or bishexafluoro acetyl acetonite copper Cu $(C_5HF_6O_2)$ are appropriately combined and introduced as a mixed gas atmosphere, and then electrodes may be formed by depositing selectively conductive materials such as Al—Si, Al—Ti, Al—Cu, Al—Si—Ti, Al—Si—Cu, for example.

Also, the above-mentioned Al-CVD method is a film formation method which has an excellent selectivity, and the surface utility of the deposited film is also excellent. Then, in the deposition process to follow, a non-selective film formation method is used to form a metal film of Al for with Al as its main component on the above-mentioned selectively deposited Al film, and the $SiO_2$ and others which serve as an insulating film. Thus it is possible to obtain a highly versatile metallic film which is suited for semiconductor wirings.

Specifically, a metal film such as this is a combination of the Al, Al—Si, Al—Ti, Al—Cu, Al—Si—Ti, or Al—Si—Cu which is selectively deposited and Al, Al—Si, Al—Ti, Al—Cu, Al—Si—Ti, or Al—Si—Cu which is deposited non-selectively or the like.

As the film formation method for the non-selective deposition, there are CVD methods, sputtering, and others in addition to the above-mentioned Al-CVD method.

The electrode configuration shown in FIG. 2 is applicable to the metal electrode leading out window for any elements. It is particularly effective when applied to introducing the impurity of a different conductive type. For example, when an emitter is formed in the base of a bipolar transistor, it is possible to secure a sufficient pressure resistance between the emitter and base, not to mention the miniaturization that can be implemented, by the application of the present invention.

(Embodiment 2)

In the Embodiment 1, the impurity introduction to the emitter is conducted by the use of ion injection. In the present embodiment, the description will be made of a case where the impurity introduction to the emitter is conducted by the use of solid phase diffusion from doped $SiO_2$.

In the same way as the Embodiment 1, there is prepared a semiconductor device having its structure as shown in FIG. 3A. Subsequently, in the same way as the Embodiment 1, resist patterning is performed, and by etching the insulating film 106, the resist is peeled. Then, without injecting ion, a CVD method is used to form the $SiO_2$ film 108 which is doped with phosphorus (P), for example. Thus, with a heat treatment being given, the emitter area 107 is produced to obtain the same structure as shown in FIG. 3C. Thereafter, the processes are the same as the Embodiment 1.

In other words, using the solid phase diffusion method according to the present embodiment, it is possible to reduce the number of processes thereby to make the process more advantageous in costwise.

(Embodiment 3)

Subsequently, the description will be made of an example where the emitter is regulated by the base electrode.

Figure 5A:
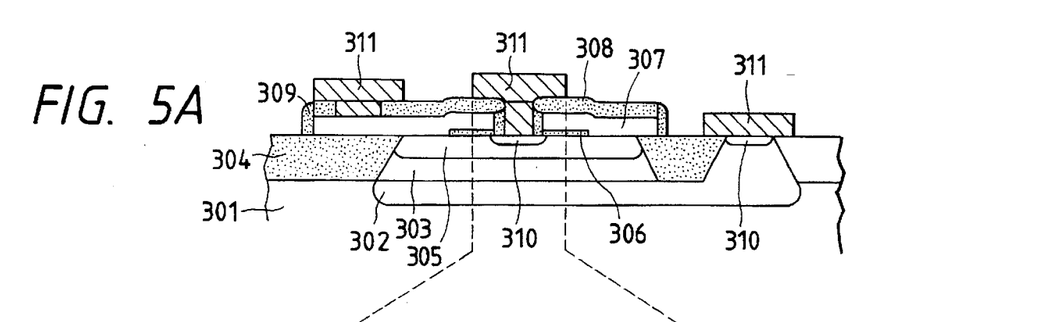
FIG. 5A is a cross-sectional view schematically showing a semiconductor device according to a third embodiment of the present invention.
Figure 5B:
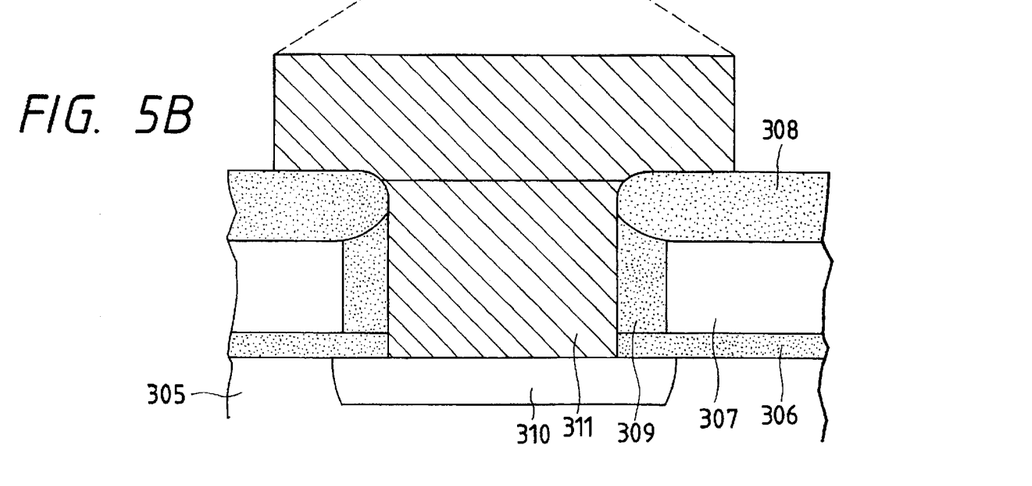
FIG. 5B is a enlargement of the emitter portion of the semiconductor in FIG. 5A.

FIG. 5A is a cross-sectional view showing a PNP bipolar transistor and FIG. 5B is an enlargement of the emitter electrode portion thereof.

A reference numeral 301 designates an N-type substrate; 302, a P-type varied area formed to reduce the collector resistance and a P-type area formed to lead out the collector electrode; 303, a P⁻ area; 304, an element separation area formed by an oxidation film; 305, an N-type base area; 306, a thermal oxidation film; 307, an N-type base electrode (polycrystalline silicon); 308, a nitriding film; 309, a thermal oxidation film (side wall area) formed by the oxidation of the polycrystalline silicon 307; 310, a P-type emitter and collector area; and 311, a metal electrode having a high covering capability, which is formed by a CVD method.

FIGS. 6A through 6E are schematic views illustrating the fabricating processes for the bipolar transistor shown in FIG. 5.

Figure 6A:
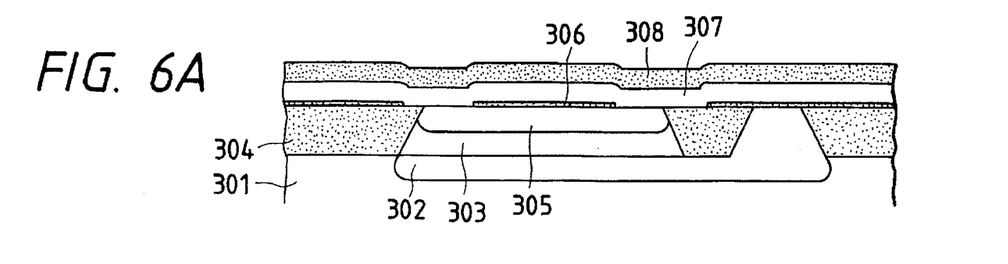
FIGS. 6A through 6E are views illustrating the fabricating processes for a semiconductor device according to the third embodiment of the present invention.
Figure 6B:
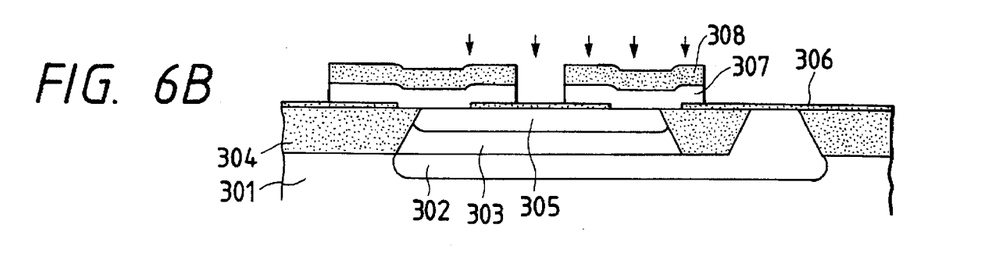

After the P-type area 302 has been formed at a desired position on the N-type semiconductor substrate 301, the P-type epitaxial area 303 is formed. Then, continuously, the silicon at the desired positions is etched, and by oxidizing only such positions selectively, the element separation area 304 is formed. Subsequently, N-type impurity is introduced into the desired positions to produce the N-type base area 305. In continuation, a thermal oxidation is given to form the insulating film 306. Further, this oxidation film 306 is etched to form the base electrode leading out window.

After that, using the LP-CVD method, the N-type polycrystalline silicon 307 and $Si_3N_4$ film 308 are formed in succession to obtain the structure shown in FIG. 6A.

Then, by patterning the base electrode 307 of the N-type polycrystalline silicon, only the emitter portion and collector portion are opened while the thin insulating film 306 being left intact. Subsequently, P-type impurity such as $BF_2^+$ is introduced by an ion injection for a dose of approximately $10^{15}$–$10^{16}$ cm$^{-2}$. To the base layer 305, no P-type impurity is introduced (FIG. 6B) because the base electrode 307 serves as a mask.

Figure 6C:
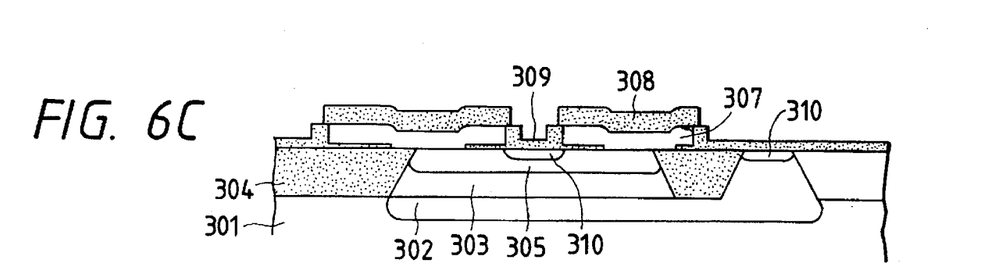
Figure 6D:
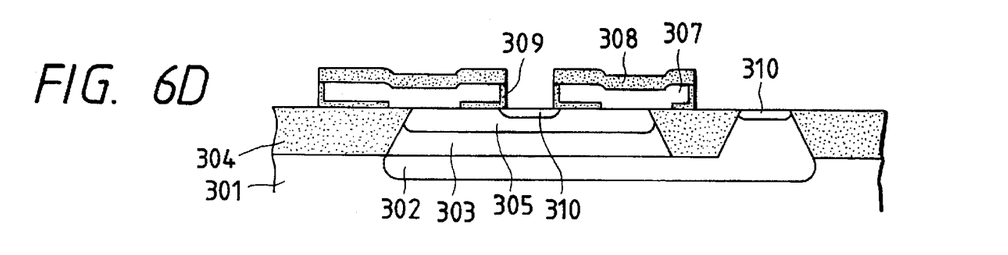

Now, in order to activate the impurity, a heat treatment is given in a gas of $N_2/O_2$, and the emitter and collector area 310 is formed. At this juncture, the upper surface of the base electrode 307 is not oxidized due to the presence of the nitriding film. Only the side face of the polycrystalline silicon 307 and the portion where the thin oxidation film 306 is formed are oxidized (FIG. 6C). When this oxidation film 309 is totally etched, the oxidation film 309 remains only on the side wall of the base electrode 307. As a result, the emitter and collector portion 310 is exposed (FIG. 6D).

Figure 6E:
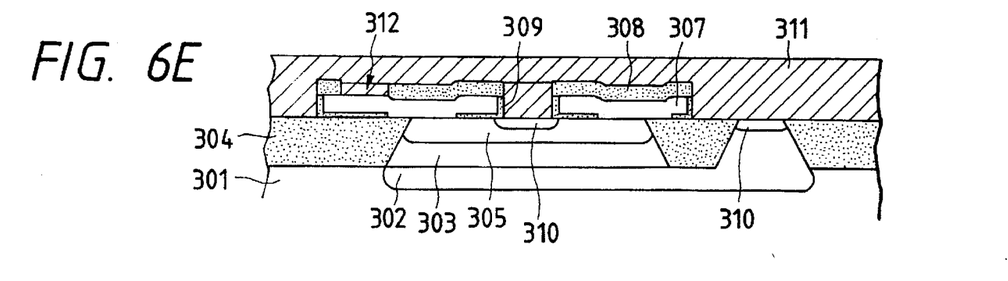

After this, the contact hole 312 for the base portion 305 is formed, and the metal film 311 is produced by the utilization of the selective deposition method described in Embodiment 1 (FIG. 6E).

Further, the metal film 311 is patterned to fabricate the bipolar transistor shown in FIG. 5.

When the base electrode is formed with a polycrystalline silicon and others as in this case, it is possible to fabricate the transistor without increasing the number of masks.

(Embodiment 4)

In the aforesaid embodiments 1 to 3, the description has been made of the application of the present invention to bipolar transistors. Now, the description will be made of the application of the present invention to an insulating gate type FET as a unipolar transistor.

Figure 7A:
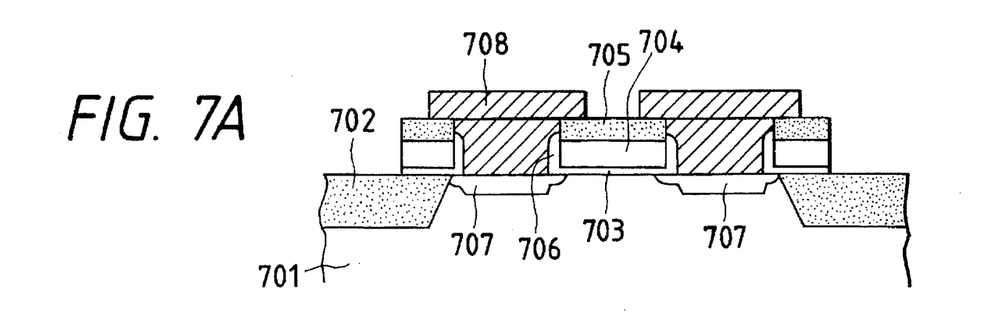
FIGS. 7A and 7B are schematic views illustrating a semiconductor device according to a fourth embodiment of the present invention.
Figure 7B:
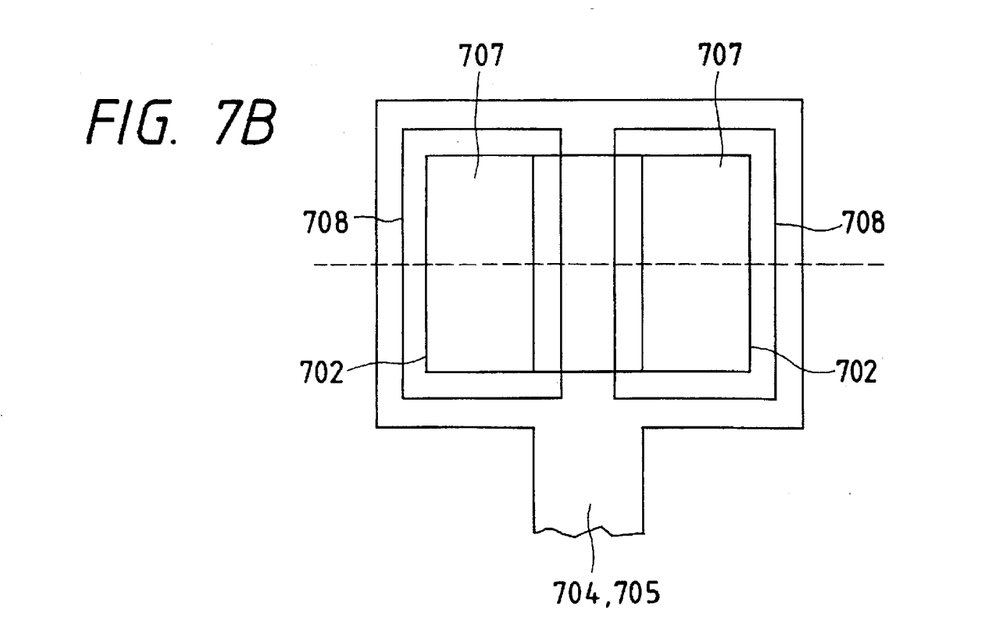

FIG. 7 shows a case where a side wall is formed in the contact hole for the source and drain. FIG. 7A is a cross-sectional view showing an MOSFET and FIG. 7B is a plan view thereof. Hereinafter, the description will be given to the case of the MOSFET. It is of course possible to apply the present invention to any PMOSFET by reversing its conductivity type.

Now, a reference numeral 701 designates a P-type substrate; 702, an element separation area; 703, a gate oxidation film; 704, a gate electrode; 705 a nitriding film; 706, a insulating side wall area; 707, a source and drain area; and 708, a metal electrode having an excellent covering capability. On the P-type substrate 701, the element separation area of oxidation silicon 702 is formed by the known method such as a selective oxidation mention. Then, the silicon dioxide film is formed as the gate insulating film 703, and the polycrystalline silicon and silicon nitride films are produced by a CVD method in succession. Now, given portions of the polycrystalline silicon and silicon nitride films are removed by photolithography. Then, with the remaining silicon nitride 704 and polycrystalline silicon 705 as masks, aersenic (As) is introduced by ion injection to form the source and drain area 707. Subsequently, the side wall 706 composed of the oxidation film is formed on the side face of the polycrystalline silicon 704 by the same method as described in Embodiment 3 Further, by the same method as described in Embodiment 1, the metal electrode 708 is produced.

The source and drain shown here correspond to the area which is doped by the same impurity as in the emitter shown in Embodiment 1, and according to the present embodiment, it is possible to fabricate the source and drain in a condition almost to the resolution limit, thus achieving a higher integration.

As described above, according to the present invention, not only the metal electrode can be formed in the doped area in its self-adjusting fashion, but also the metal electrode thus formed has excellent crystallinity and smoothness. Therefore, according to the present invention, it is possible to fabricate semiconductor devices with a finer structure and higher reliability at a lower cost.

What is claimed is:

1. A method of producing a semiconductor device including a bipolar transistor, comprising the steps of:

(a) forming a semiconductor layer of a first conductivity type for formulation into a base region on a substrate;

(b) providing an insulating film of a width W1 on the semiconductor layer;

(c) providing a conductive layer, for formulating into a base electrode, so that the conductive layer covers the insulating film on the semiconductor layer and contacts the semiconductor layer;

(d) providing a nitride layer on the conductive layer;

(e) removing partially the conductive layer and the nitride layer, for forming an opening having a width W2, which is smaller than the width W1 of the insulating film;

(f) introducing a dopant into the opening for forming a semiconductor layer of a second conductivity type, for formulation into a emitter, within the semiconductor layer;

(g) after said step (f), performing an oxidization for forming an oxide at a side wall and at a bottom wall of the opening;

(h) etching for removing the oxide and the insulating film at the bottom of the opening, with the oxide remaining at the side wall; and (i) burying a conductor within the opening for forming an emitter electrode for contact to the semiconductor layer.

2. A method of producing a semiconductor device according to claim 1, wherein the conductor is deposited selectively by a CVD process using alkyl aluminum hydride.

3. A method of producing a semiconductor device according to claim 2, wherein the alkyl aluminum hydride is dimethyl aluminum hydride.

* * * * *

UNITED STATES PATENT AND TRADEMARK OFFICE
CERTIFICATE OF CORRECTION

PATENT NO. : 5,663,097

DATED : September 2, 1997

INVENTOR(S): MASARU SAKAMOTO ET AL.

It is certified that error appears in the above-identified patent and that said Letters Patent is hereby corrected as shown below:

COLUMN 1
Line 21, "are" should read --is--;
Line 22, "creaselessly" should read --ceaselessly--;
Line 24, "machinining" should read --machining--;
Line 38, "et al" should read --et al.--;
Line 43, "One" should read --one--;
Line 67, "ion is" should read --ions are--.

COLUMN 2
Line 14, "of," should read --of--;
Line 34, "object," should read --objects,--;
Line 52, "step" should read --steps--.

COLUMN 3
Line 3, "OF" should read --of--;
Line 38, "method" should read --a method--;
Line 50, "introduction" should read --introductions,--;
Line 63, "from" should be deleted.

COLUMN 4
Line 4, "Using" should read --using--;
Line 5, "tungusten" should read --tungsten--;
Line 30, "On" should read --on--.

COLUMN 5
Line 4, "For," should read --For--;
Line 20, "relation. Hence" should read --relation, hence--;
Line 24, "is" should read --are--;
Line 27, "are" should read --is--.

UNITED STATES PATENT AND TRADEMARK OFFICE
CERTIFICATE OF CORRECTION

PATENT NO. : 5,663,097

DATED : September 2, 1997

INVENTOR(S) : MASARU SAKAMOTO ET AL.

It is certified that error appears in the above-identified patent and that said Letters Patent is hereby corrected as shown below:

COLUMN 6
  Line 11, "Åto" should read --Å to--;
  Line 27, "electron is" should read --electrons are-- (both occurrences);
  Line 36, "electron" should read --electrons--;
  Line 46, "tungusten," should read --tungsten,--;
  Line 49, "tungusten" should read --tungsten--;
  Line 50, "siliside" (both occurrences) should read --silicide--.

COLUMN 7
  Line 14, "for" should read --or--;
  Line 56, "in" should be deleted.

COLUMN 8
  Line 25, "being" should read --is--;
  Line 58, "an" should be --a--;
  Line 65, "705" should read --705,--.

UNITED STATES PATENT AND TRADEMARK OFFICE
CERTIFICATE OF CORRECTION

PATENT NO. : 5,663,097

DATED : September 2, 1997

INVENTOR(S): MASARU SAKAMOTO ET AL.

It is certified that error appears in the above-identified patent and that said Letters Patent is hereby corrected as shown below:

COLUMN 9
  Line 10, "aersenic" should read --arsenic--;
  Line 14, "Embodiment 3" should read --Embodiment 3.--

COLUMN 10
  Line 15, "a" should read --an--.

Signed and Sealed this

First Day of September, 1998

BRUCE LEHMAN

Attest:

Attesting Officer

Commissioner of Patents and Trademarks